(12) United States Patent
Leisenheimer et al.

(10) Patent No.: US 12,306,218 B2
(45) Date of Patent: May 20, 2025

(54) MAGNETIC-FIELD-BASED CURRENT MEASURING DEVICE AND METHOD FOR MAGNETIC-FIELD-BASED MEASUREMENT OF ELECTRIC CURRENTS

(71) Applicant: Infineon Technologies AG, Neubiberg (DE)

(72) Inventors: Stephan Leisenheimer, Oberhaching (DE); Richard Heinz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 18/183,706

(22) Filed: Mar. 14, 2023

(65) Prior Publication Data

US 2023/0305042 A1 Sep. 28, 2023

(30) Foreign Application Priority Data

Mar. 24, 2022 (DE) .......................... 102022202940.2

(51) Int. Cl.
*G01R 19/00* (2006.01)
*G01R 15/20* (2006.01)

(52) U.S. Cl.
CPC ....... *G01R 19/0092* (2013.01); *G01R 15/202* (2013.01)

(58) Field of Classification Search
USPC ........................................ 324/117 H, 117 R
See application file for complete search history.

(56) References Cited

U.S. PATENT DOCUMENTS

| 9,103,853 B2 | 8/2015 | Ausserlechner et al. |
| 10,488,445 B2 * | 11/2019 | Ausserlechner ....... G01R 33/06 |
| 2006/0114096 A1 * | 6/2006 | Chamon ................ H03K 17/92 |
| | | 338/32 R |

FOREIGN PATENT DOCUMENTS

| DE | 10045670 A1 | 8/2008 |
| DE | 10141849 B4 | 9/2014 |
| DE | 102015219364 A1 | 6/2016 |

* cited by examiner

*Primary Examiner* — Vincent Q Nguyen
(74) *Attorney, Agent, or Firm* — Harrity & Harrity, LLP (57) ABSTRACT

The innovative concept described herein relates to a magnetic-field-based current measuring device. The latter includes, inter alia, an at least two-dimensionally measuring magnetic field sensor mounted at a node at which a first, a second and a third electrical conductor, each coming from different directions, are brought together. The magnetic field sensor is configured to determine in each case a magnitude and/or a direction of the magnetic fields which are respectively generated in the first, second and third electrical conductors and meet at the node, and to derive, on the basis thereof, information about a magnitude and/or a direction of the individual electric currents flowing at the node. The innovative concept described herein additionally relates to a corresponding method for magnetic-field-based measurement of electric currents using a magnetic-field-based current measuring device.

20 Claims, 7 Drawing Sheets

MAGNETIC-FIELD-BASED CURRENT MEASURING DEVICE AND METHOD FOR MAGNETIC-FIELD-BASED MEASUREMENT OF ELECTRIC CURRENTS

CROSS REFERENCE TO RELATED APPLICATION

This application claims priority to German Patent Application No. 102022202940.2 filed on Mar. 24, 2022, the content of which is incorporated by reference herein in its entirety.

TECHNICAL FIELD

The innovative concept described herein relates to a magnetic-field-based current measuring device which can be used to ascertain electric currents in conductors, specifically based on a measurement of the magnetic fields induced by the flowing currents. The magnetic-field-based current measuring device described herein can ascertain the magnitude and/or the direction of the magnetic field vectors and, on the basis thereof, deduce the magnitude and/or direction of the corresponding electric currents.

In electrical systems it is often desirable to ascertain the electric current per load, whether for functional reasons, for diagnosis purposes or in regard to safety-relevant aspects. A multiplicity of different current measuring devices exist for this purpose, such as ammeters or different types of current sensors, for example.

SUMMARY

For the purpose of current measurement, the respective current measuring devices are connected to an electrical conductor in order to be able to measure the currents flowing in this very conductor. If a plurality of conductors are present, then either the current measuring device may be successively connected to the individual conductors, or a plurality of current measuring devices may be present, which are then connected to the respective conductors.

While the first variant is time-intensive, the second variant is associated with higher costs. A further cost driver is the quality of the current measuring devices. Current sensors that carry out precise measurement are demanded in many applications, such as in microelectronics, for example. Moreover, there is often interest in ascertaining not only the magnitude of the current but also the direction thereof, e.g., the current flow direction, precisely but at the same time also very rapidly.

It would therefore be desirable to provide a current measuring device which is realizable with simple means, that is to say cost-effectively, and which at the same time can rapidly and precisely measure the magnitude and the direction of the current, preferably simultaneously in a plurality of conductors.

This is made possible by the magnetic-field-based current measuring device as claimed in claim 1 and by the corresponding method for magnetic-field-based measurement of electric currents as claimed in claim 17.

The innovative magnetic-field-based current measuring device described herein comprises, inter alia, an at least two-dimensionally measuring magnetic field sensor mounted at a node at which a first, a second and a third electrical conductor, each coming from different directions, are brought together. The magnetic field sensor is configured to determine in each case a magnitude and/or a direction of the magnetic fields which are respectively generated in the first, second and third electrical conductors and meet at the node, and to derive, on the basis thereof, information about a magnitude and/or a direction of the individual electric currents flowing at the node.

The corresponding method for magnetic-field-based measurement of electric currents comprises method steps including providing an at least two-dimensionally measuring magnetic field sensor mounted at a node at which a first, second and third electrical conductor, each coming from different directions, are brought together. A further method step includes ascertaining, using the magnetic field sensor, a respective magnitude and/or a respective direction of the magnetic fields which are respectively generated in the first, second and third electrical conductors and meet at the node and deriving information about a magnitude and/or a direction of the individual electric currents flowing at the node based on the ascertained magnitudes and/or directions of the respective magnetic fields.

Further implementations and advantageous aspects of the magnetic-field-based current measuring device and of the corresponding method for magnetic-field-based measurement of electric currents are mentioned in the respective dependent patent claims.

BRIEF DESCRIPTION OF THE DRAWINGS

Some example implementations are illustrated by way of example in the drawing and are explained below. In the drawing.

DETAILED DESCRIPTION

Example implementations are described in greater detail below with reference to the Figs., wherein elements having the same or a similar function are provided with the same reference signs.

Method steps which are presented or described in the context of the present disclosure can also be implemented in a different order than that presented or described. Moreover, method steps which relate to a specific feature of a device are interchangeable with this very feature of the device, which likewise holds true the other way around.

Figure 1:
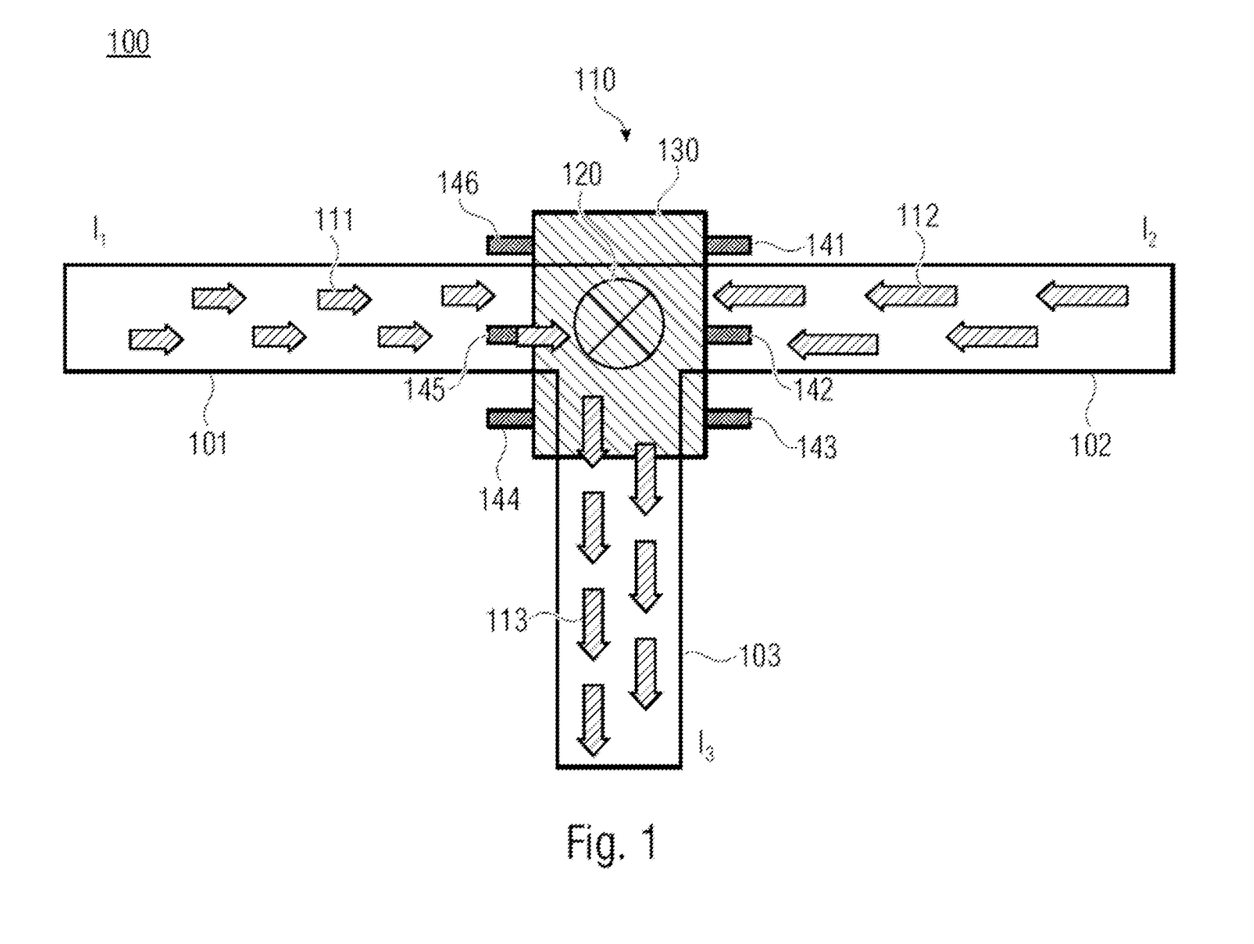
FIG. 1 shows a schematic view of a magnetic-field-based current measuring device in accordance with one example implementation.

FIG. 1 shows a schematic plan view of a magnetic-field-based current measuring device 100 in accordance with the innovative concept described herein. A first electrical conductor 101, a second electrical conductor 102 and a third electrical conductor 103 can additionally be seen. The three conductors 101, 102, 103 are brought together at a node 120. The three conductors 101, 102, 103 lead to the node 120 from different directions. The T-shaped linking at the node 120 as shown here is purely by way of example. In principle, the three conductors 101, 102, 103 can come from arbitrary different directions where they are brought together at the node 120. Details in this respect will be explained in even greater detail below.

The magnetic-field-based current measuring device 100 comprises an at least two-dimensionally measuring magnetic field sensor 110. The magnetic field sensor 110 is illustrated in the form of a package 130 here purely by way of example, which package can comprise connecting lugs 141, . . . , 146 illustrated schematically.

The magnetic field sensor 110 is mounted at the node 120 described above. In this case, the magnetic field sensor 110 can preferably be mounted at the node 120 in such a way that a sensor area (not illustrated explicitly here) of the magnetic field sensor 110 is arranged opposite at least one of the three conductors 101, 102, 103. The magnetic field sensor 110 can be mounted at the node 120 for example in such a way that its sensor area is arranged opposite the node 120. The magnetic field sensor 110 can be arranged for example over or on the conductors 101, 102, 103, or under the conductors 101, 102, 103.

If an electric current flows in the electrical conductors 101, 102, 103, this current causes a magnetic field in the respective conductor. In this regard, for example, a current $I_1$ flowing in the first conductor 101 can generate a first magnetic field, which is illustrated purely symbolically here using the magnetic field vectors 111. A current $I_2$ flowing in the second conductor 102 can generate a second magnetic field, which is illustrated here purely symbolically using the magnetic field vectors 112. A current $I_3$ flowing in the third conductor 103 can accordingly generate a third magnetic field, which is illustrated here purely symbolically using the magnetic field vectors 113.

The magnetic field vectors 111, 112, 113 illustrated purely symbolically here identify a direction of the magnetic field occurring in the respective conductor 101, 102, 103, represented by the arrow direction of the respective magnetic field vectors 111, 112, 113, and a magnitude of the magnetic field occurring in the respective conductor 101, 102, 103, represented by the length of the respective magnetic field vectors 111, 112, 113.

As stated, the magnetic field vectors 111, 112, 113 should be understood purely symbolically here. The real magnetic field distribution at the respective conductors 101, 102, 103 may turn out to be different in reality, e.g., in accordance with the right-hand rule.

What is crucial, however, is that the magnetic field sensor 110 is configured to determine in each case a magnitude and/or a direction of the magnetic fields which are respectively generated in the first, second and third electrical conductors 101, 102, 103 and meet at the node 120. For this purpose, the magnetic field sensor 110 can be an at least two-dimensionally measuring magnetic field sensor (2D magnetic sensor). The latter can perform a magnetic field vector measurement or a vectorial magnetic field measurement, e.g., the magnitude and the direction of the magnetic field can be ascertained.

On the basis thereof, the magnetic field sensor 110 can derive information about a magnitude and/or a direction of the individual electric currents $I_1$, $I_1$, $I_3$ flowing at the node. The magnetic field sensor 110 can thus determine the currents $I_1$, $I_2$, $I_3$ flowing in the respective conductors 101, 102, 103 using a vectorial magnetic field measurement.

By way of example, using a vectorial magnetic field measurement of the magnetic field generated in the first conductor 101 (see magnetic field vectors 111), the magnetic field sensor 110 can determine the first electric current $I_1$ flowing in the first conductor 101. To put it more precisely, the magnetic field sensor 110 can determine the magnitude and/or the direction of the first electric current $I_1$ flowing in the first conductor 101.

Alternatively or additionally, using a vectorial magnetic field measurement of the magnetic field generated in the second conductor 102 (see magnetic field vectors 112), the magnetic field sensor 110 can determine the second electric current $I_2$ flowing in the second conductor 102. To put it more precisely, the magnetic field sensor 110 can determine the magnitude and/or the direction of the second electric current $I_2$ flowing in the second conductor 102.

Alternatively or additionally, using a vectorial magnetic field measurement of the magnetic field generated in the third conductor 103 (see magnetic field vectors 113), the magnetic field sensor 110 can determine the third electric current $I_3$ flowing in the third conductor 103. To put it more precisely, the magnetic field sensor 110 can determine the magnitude and/or the direction of the third electric current $I_3$ flowing in the third conductor 103.

The same also holds true, of course, for a conceivable fourth conductor, and for all further conceivable conductors that are connected to the common node 120.

Accordingly, the magnetic field sensor 110 can thus be configured to determine, based on the directions of the magnetic fields 111, 112, 113 ascertained in each case at the node 120, in which direction a first electric current $I_1$ in the first conductor 101, a second electric current $I_2$ in the second conductor 102 and a third electric current $I_3$ in the third conductor 103 respectively flows.

Alternatively or additionally, the magnetic field sensor 110 can be configured to determine, based on the magnitudes of the magnetic fields 111, 112, 113 ascertained in each case at the node 120, the respective magnitude of a first electric current $I_1$ in the first conductor 101, a second electric current $I_2$ in the second conductor 102 and a third electric current $I_3$ in the third conductor 103.

As has already been mentioned in the introduction, the magnetic field sensor 110 can be mounted at the node 120. This also includes a certain close vicinity around the node 120. According to the discussion above, the magnetic field sensor can be arranged at the node 120 (or around the node 120) for example in such a way that a sensor area (not illustrated explicitly here) of the magnetic field sensor 110 can measure with sufficient accuracy, and distinguish from one another, the magnetic field vectors 111, 112, 113 or electric currents $I_1$, $I_2$, $I_3$ flowing together at the node 120.

That is to say that the magnetic field sensor 110 can distinguish the direction from which a magnetic field vector 111, 112, 113 or electric current $I_1$, $I_2$, $I_3$ arriving at the node 120 comes. Alternatively or additionally, the magnetic field sensor 110 can determine the magnitude of the respective magnetic field vector 111, 112, 113 or electric current $I_1$, $I_2$, $I_3$.

This has really key advantages. By way of example, the magnetic field sensor 110 can be configured to deduce an operating state of an electrical or electronic component 310 connected to the electrical conductors 101, 102, 103 based on the ascertained directions and/or magnitudes of the respective magnetic fields 111, 112, 113 or electric currents $I_1$, $I_2$, $I_3$ which meet at the node 120. This will be explained in greater detail below with reference to FIGS. 2 and 3A to 3C.

Figure 2:
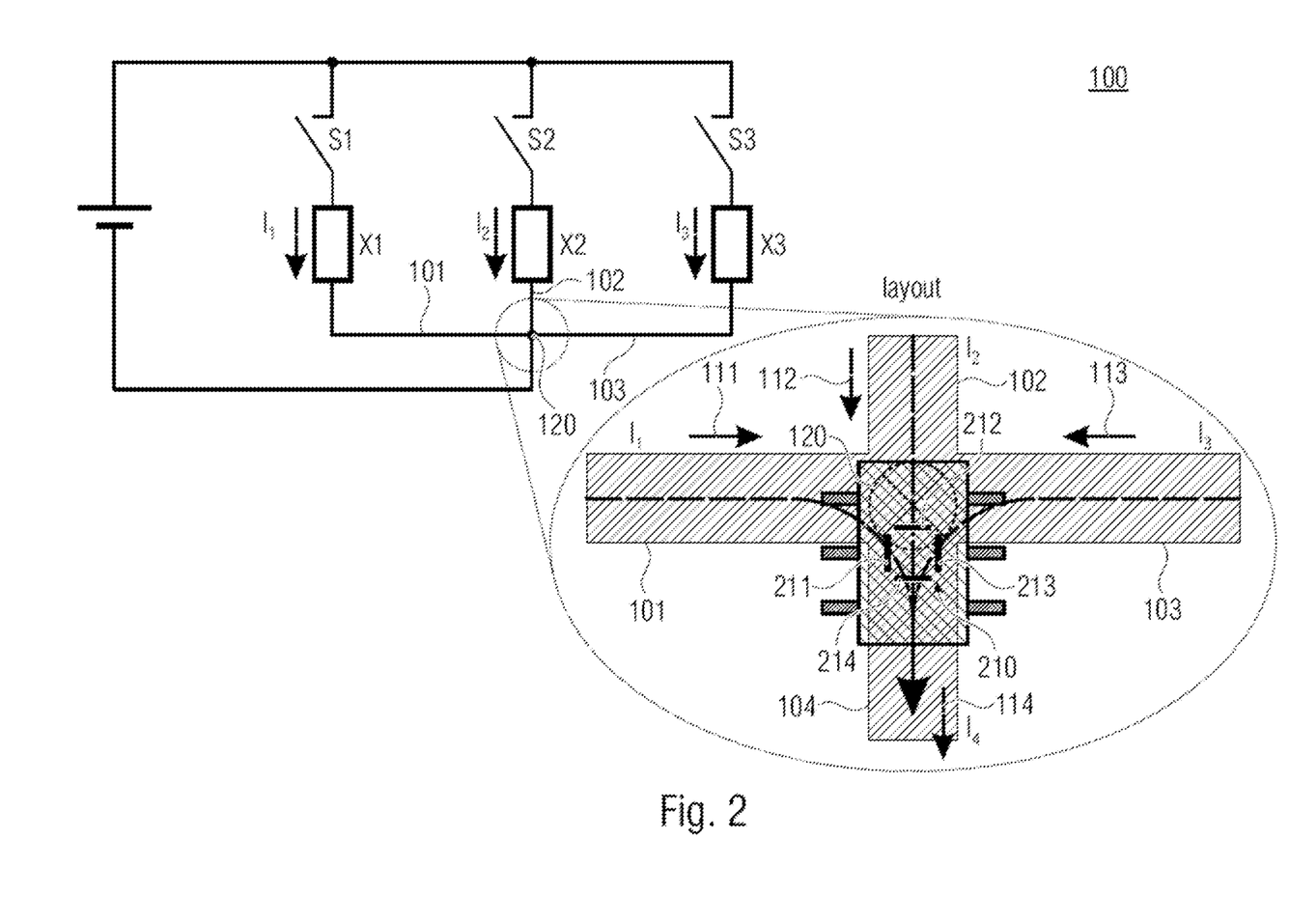
FIG. 2 shows a schematic view of a magnetic-field-based current measuring device in a schematic electrical circuit in accordance with one example implementation.

Firstly, reference should be made to FIG. 2 in this respect. An electrical circuit with a parallel connection of three resistive loads X1, X2, X3 is shown here by way of example. Each load X1, X2, X3 is arranged in a current branch with corresponding electrical conductors 101, 102, 103. In this regard, the first resistive load X1 is arranged in a first current branch comprising a first electrical conductor 101, in which a first electric current $I_1$ flows. The second resistive load X2 is arranged in a second current branch comprising a second electrical conductor 102, in which a second electric current $I_2$ flows. The third resistive load X3 is arranged in a third current branch comprising a third electrical conductor 103, in which a third electric current $I_3$ flows.

The electrical conductors 101, 102, 103 intersect at a common node 120. In this case, the conductors 101, 102, 103 each run to the node 120 from different directions.

An enlarged illustration of the node 120 is shown at the bottom right in the Fig. This also reveals how the respective electric currents $I_1$, $I_2$, $I_3$ flow together at the node 120. In this non-limiting example, the currents $I_1$, $I_2$, $I_3$ flowing in the first, second and third electrical conductors 101, 102, 103 flow toward the node and combine there to form the common current $I_4$ in the fourth conductor 104, which flows away from the node 120. In this example, the fourth current $I_4$ arises in accordance with Kirchhoff's voltage law as: $I_1 + I_2 + I_3 = I_4$ In the respective conductors 101, . . . , 104 the electric currents $I_1$, $I_2$, $I_3$, $I_4$ flowing therein respectively generate a magnetic field, which is illustrated here once again purely schematically based on the symbolic magnetic field vectors 111, 112, 113, 114 in the respective conductors 101, . . . , 104.

A magnetic field sensor 110 in accordance with the innovative concept described herein is arranged at the node 120. It is evident that the magnetic field sensor 110 need not be mounted exactly in the center of the node 120. The magnetic field sensor 110 can be arranged somewhat offset, for example, but preferably in such a way that a sensor area 210 of the magnetic field sensor 110 can measure with sufficient accuracy, and distinguish from one another, the magnetic field vectors 111, 112, 113, 114 or electric currents $I_1$, $I_2$, $I_3$, $I_4$ flowing together at the node 120.

In the non-limiting example shown here the magnetic field sensor 110 can be configured as a two-dimensionally measuring Hall sensor. The latter can comprise at least two vertical Hall elements 211, 212. The Hall elements 211, 212 can be oriented at an angle of 90° with respect to one another in order accordingly to determine an x-component and a y-component of the magnetic field vectors 111, . . . , 114.

In order to improve the accuracy of the Hall sensor 110, the latter can comprise two further vertical Hall elements 213, 214, which are likewise arranged at an angle of 90° with respect to one another. As is shown purely by way of example in FIG. 2, the four Hall elements 211, . . . , 214 can be arranged in such a way that each Hall element is offset by 90° relative to its respective adjacent Hall element.

This can be particularly advantageous if the electrical conductors 101, 104 are likewise offset by in each case 90° relative to one another, as is shown in FIG. 2. The Hall sensor 110 can be oriented in such a way that the individual Hall elements 211, . . . , 214 are substantially perpendicular to the current flow direction in the respective conductor 101, . . . , 104. Referring to FIG. 2, this would mean that the current flow direction of the first current $I_1$ in the first conductor 101 is directed substantially perpendicularly to the first Hall element 211. The same would hold true for the current flow directions of the second, third and fourth currents $I_2$, $I_3$, $I_4$ relative to the second, third and fourth Hall elements 212, 213, 214.

As an alternative to the Hall sensor, the magnetic field sensor 110 can also be configured as a magnetoresistive sensor, which ascertains the magnetic fields 111, . . . , 114 based on the magnetoresistive effect. They include for example AMR sensors (AMR: Anisotropic Magnetoresistance), GMR sensors (GMR: Giant Magnetoresistance), TMR sensors (TMR: Tunnel Magnetoresistance), CMR sensors (CMR: Colossal Magnetoresistance), EMR sensors (EMR: Extraordinary Magnetoresistance) and the like, which can be combined as usual under the designation xMR.

As an alternative to a two-dimensionally measuring magnetic field sensor (2D sensor), the magnetic field sensor 110 can be configured as a three-dimensionally measuring magnetic field sensor (3D sensor). The latter could ascertain not only the x- and y-components directed parallel to the chip plane but also a z-component of the magnetic field vectors that is directed perpendicularly to the chip plane.

Irrespective of the concrete configuration of the magnetic field sensor 110, the latter is configured to measure the magnetic fields which meet at the node 120 (see the magnetic field vectors 111, . . . , 114) and to determine the magnitude and/or the direction of the respective magnetic field vector 111, . . . , 114. On the basis thereof, the magnetic field sensor 110 can then ascertain the currents $I_1$, $I_2$, $I_3$, $I_4$ flowing in the respective conductor 101, . . . , 104. Preferably, the magnetic field sensor 110 can determine the magnitude and/or the direction of the currents $I_1$, $I_2$, $I_3$, $I_4$, flowing in the respective conductor 101, . . . , 104.

In the example implementation depicted in FIG. 2, based on the measured magnetic field vectors 111, . . . , 114, for example, the magnetic field sensor 110 can determine that the electric currents $I_1$, $I_2$, $I_3$ respectively flowing in the first, second and third conductors 101, 102, 103 enter the node 120, while the current $I_4$ flowing in the fourth conductor 104 emerges from the node.

In electrical systems it is often desirable to ascertain the electric current $I_1$, $I_2$, $I_3$ per load, whether for functional reasons, for diagnosis purposes or in regard to safety-relevant aspects. In the example shown in FIG. 2 with three loads X1, X2, X3, it would thus be of interest, for example, to measure the respective individual currents $I_1$, $I_2$, $I_3$.

In conventional current measuring methods, a single current sensor could be arranged in the fourth conductor 104 in order to measure the fourth current $I_4$ flowing there. In accordance with Kirchhoff's voltage law mentioned above, the current would be composed of all three individual currents $I_1$, $I_2$, $I_3$. There would be the problem here, however, that the contribution made by the respective individual currents $I_1$, $I_2$, $I_3$ to the total current $I_4$ cannot be tracked. As a remedy, therefore, in conventional current measuring methods, a respective current sensor is incorporated in each current branch, but that can rapidly become very expensive in the case of complex systems having a multiplicity of current branches.

As has been described above, the magnetic field sensor 110 in accordance with the innovative concept described herein is mounted at the node 120 at which all the currents come together, and is configured to determine the individual currents $I_1$, $I_2$, $I_3$, $I_4$ that come together at the node 120 in terms of their magnitude and/or direction. A single magnetic field sensor 110 thus suffices to determine the currents in a multiplicity of current branches if the currents come together at a common node. This considerably reduces the production costs for sensor-based current measurement.

One conceivable field of use will be described by way of example below with reference to FIGS. 3A to 3C. A so-called H-bridge is shown here, in which five two-terminal networks 310, . . . , 315 are interconnected in the form of the upper-case letter "H". The cross-connection 330 is also referred to as bridge branch. An electric motor 310 is arranged in the bridge branch 330. A respective switching element 310, . . . , 314 is arranged in the four current branches 331, . . . , 334 separated by the cross-connection 330. The switching elements 310, . . . , 314 serve either to block or to allow the current flow in the respective current branch 331, . . . , 334 depending on the switching state. A different current path through the individual current branches 331, . . . , 334 arises, depending on which of the four switching elements 310, . . . , 314 are open or closed.

Keeping the nomenclature from FIG. 1, a first conductor 101, a second conductor 102 and a third conductor 103 are connected to one another at a common node 120. The first conductor 101 is connected to a first switching element 311 in this example, the second conductor 102 is connected to a second switching element 312 in this example, and the third conductor 103 is connected to a voltage supply 320 in this example.

A magnetic field sensor 110 in accordance with the innovative concept described herein is arranged at the node 120. The magnetic field sensor is not depicted in detail here, however, on account of the size relationships in the drawing. In this regard, reference should be made to the above discussion referring to FIGS. 1 and 2.

In H-bridge circuits of this type, it may be extremely helpful to ascertain the different operating states of the electrical component 310 in the bridge branch 330, e.g., here of the motor 310. Depending on a desired operating state of the motor 310, the four switching elements 311, . . . , 314 are interconnected accordingly so as to result in a current flow direction in the respective current branches that is desired for the respective operating state.

Operating states that may be of interest in the case of an electric motor 310 would be for example an ON state (motor on), in which the motor 310 is driven, a braking or recuperation state, in which a motor braking function takes effect and the motor 310 generates power in the sense of a generator, or a freewheeling state, in which the motor 310 rotates substantially freely to the greatest possible extent without a motor braking effect.

One non-limiting application example would be an electrically actuated cargo compartment such as is installed in ATVs (All Terrain Vehicles), for example. The motor 310 can electrically actuate the cargo compartment in order to open and close the latter. However, the cargo compartment is intended to be manually actuable as well. In this case, however, the manual force would act counter to the motor force, that is to say that it would be necessary to work against the motor braking effect during opening and closing. This makes manual opening and closing of the cargo compartment considerably more difficult.

In this application example, it would therefore be of interest to detect manual actuation of the cargo compartment. This is because in this case the motor 310 could then be switched into a freewheeling state in which the manual actuation force is no longer opposed by an appreciable motor braking effect. Similar applications also arise in the case of BLDC motors, e.g., in the case of brushless direct current motors (BLDC: Brushless Direct Current).

As mentioned initially, the operating state of the motor 310 in the H-bridge circuit depends on how the individual switching elements 311, . . . , 314 are switched. FIG. 3A shows one example of an ON state of the motor 310 (motor ON). Here, out of the total of four switching elements 311, . . . , 314 are open, and the other two switching elements are closed. In the non-limiting example depicted here, the second switching element 312 and the fourth switching element 314 situated diagonally opposite would be open, while the first switching element 311 (situated laterally opposite the second switching element 312) and the third switching element 313 situated diagonally opposite the first switching element 311 (and laterally opposite the fourth switching element 314) would be closed.

Figure 3A:
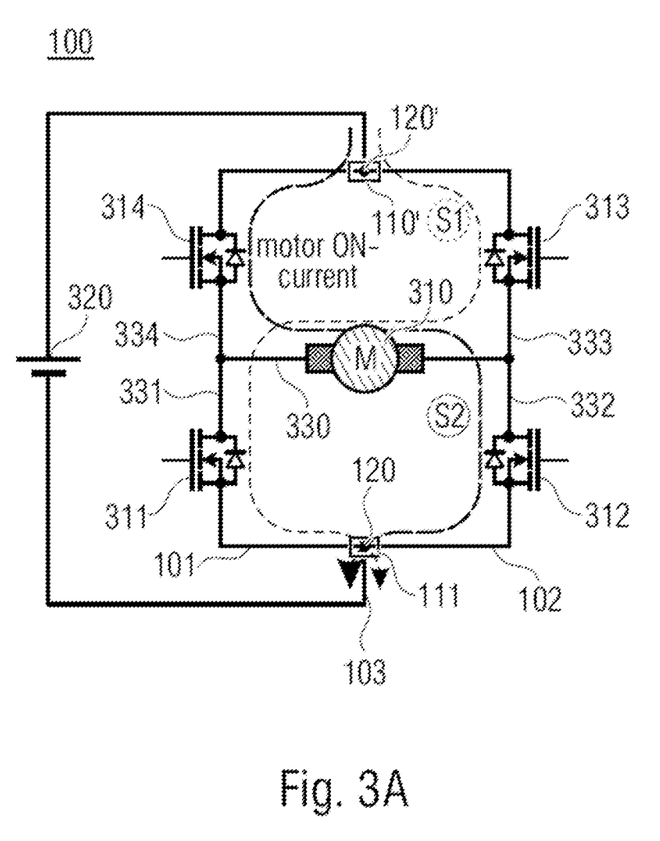
FIGS. 3A-3C show a schematic view of a magnetic-field-based current measuring device in accordance with one example implementation for ascertaining different operating states of an electric motor.

This results in the current path depicted in FIG. 3A, in which the current flows from the upper node 120', via the open fourth switching element 314, then via the motor 310, and finally via the open second switching element 312 to the lower node 120. This could be one conceivable switching combination for realizing the ON state of the motor 310.

Depending on the implementation, it would also be conceivable, of course, for alternatively the first and third switching elements 311, 313 to be open, while the second and fourth switching elements 312, 314 would be closed. Depending on the polarity of the voltage source (or current source) 320, it would also be conceivable for the current to flow in the opposite direction to what is depicted purely schematically in FIG. 3A. The same also applies, of course, to the schematic circuits shown in FIGS. 3B and 3C.

Staying with the circuit example depicted in FIG. 3A, therefore, in the ON state of the motor 310, the current would flow from the second conductor 102 into the node 120, and from there into the third conductor 103. This is referred to hereinafter as a second current flow S2 or as a second current flow direction S2. The magnetic fields generated in the respective conductors 102, 103 in the process can be measured using the magnetic field sensor 110 mounted at the node 120. The magnetic field sensor 110 can deduce the abovementioned current flow direction S2 based on the magnetic fields or magnetic field vectors measured at the node 120, and in particular based on the ascertained directions of the magnetic fields which are respectively generated in the individual conductors 102, 103.

The magnetic field sensor 110 (or a controller coupled to the magnetic field sensor 110) can derive the operating state of the motor 310 (here: motor on) based on the current flow direction ascertained at the node 120 (here: the second current flow direction S2 from the second conductor 102 into the third conductor 103).

As mentioned initially, it may be conceivable (e.g., with the polarity of voltage source 320 having been reversed) for the current flow direction to be reversed. In that case, in the ON state, the current would flow from the third conductor 103 via the node 120 into the second conductor 102, which however would of course likewise be recognized by the magnetic field sensor 110.

The magnetic field sensor 110 can thus be configured to detect at the node 120 a current flow S2 between the second conductor 102 and the third conductor 103, irrespective of the direction in which the current is actually flowing in this case.

As has likewise been mentioned above, in the ON state, depending on the implementation of the circuit, the current can alternatively also flow between the first conductor 101 and the third conductor 103 via the node 120. This is illustrated using dashed lines in FIG. 3A and is referred to hereinafter as a first current flow S1 or as a first current flow direction S1. Here, too, it is once again possible, e.g., depending on the polarity of the voltage source (or current source) 320, for the current to flow from the first conductor 101 via the node 120 into the third conductor 103, or actually from the third conductor 103 via the node 120 into the first conductor 101.

In summary, therefore, the magnetic field sensor 110 can be configured to detect an active ON operating state of the electric motor 310, using the magnetic field sensor 110 ascertaining a first current flow S1 between the first conductor 101 and the third conductor 103 at the node 120, or using the magnetic field sensor 110 ascertaining a second current flow S2 between the second conductor 102 and the third conductor 103 at the node 120. In this case (ON state) the current thus flows at the node 120 between the conductor 103 connected to the voltage source (or current source) 320 and one of the conductors 101, 102 connected respectively to one of the switching elements 311, 312.

Figure 3B:
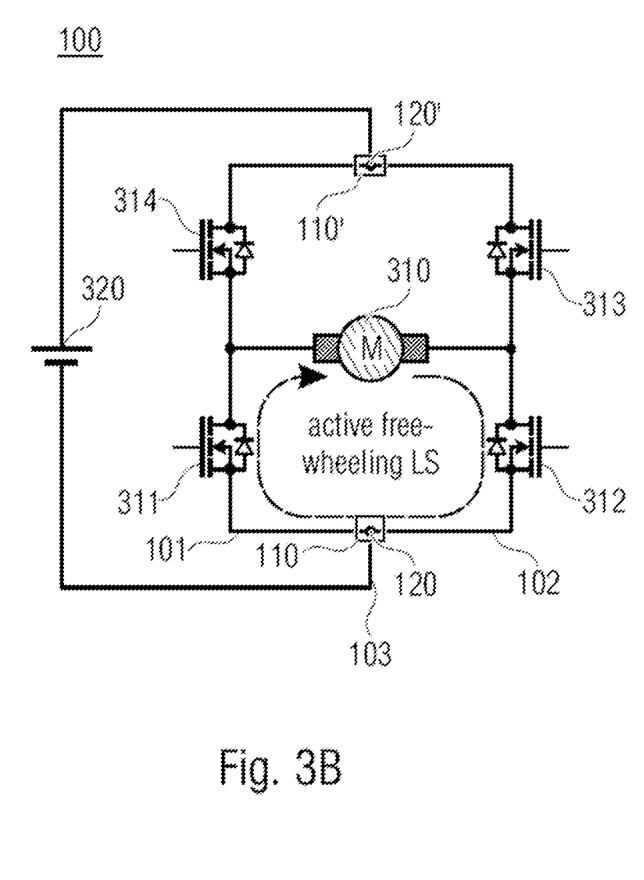

FIG. 3B shows one possibility for realizing a freewheeling state of the motor 310. Here the switching elements 311, ..., 314 are switched in such a way as to give rise to a current flow in the lower part of the H-bridge. For example, as illustrated schematically here, the first switching element 311 and the second switching element 312 can be open, while the third switching element 313 and the fourth switching element 314 are closed.

Accordingly, a current flow between the first conductor 101 and the second conductor 102 would be established at the node 120, and could be ascertained using the magnetic field sensor 110 in the manner described herein. By way of example, the current can flow from the second conductor 102 into the node 120, and can flow from the node 120 into the first conductor 101. The magnetic field sensor 110 can deduce the abovementioned current flow direction based on the magnetic fields or magnetic field vectors measured at the node 120, and in particular based on the ascertained directions of the magnetic fields which are respectively generated in the individual conductors 101, 102.

The magnetic field sensor 110 (or a controller coupled to the magnetic field sensor 110) can derive the operating state of the motor 310 (here: freewheeling) based on the current flow direction ascertained at the node 120 (here: from the second conductor 102 into the first conductor 101).

As an alternative thereto, besides the current flow direction at the node 120 shown by way of example in FIG. 3B (from the second conductor 102 via the node 120 into the first conductor 101), it is also possible for an oppositely directed current flow direction to occur at the node 120 (e.g., from the first conductor 101 via the node 120 into the second conductor 102). In this case, too, the current flow could be ascertained using the magnetic field sensor 110 in the manner described herein and an operating state of the motor 310 could be derived by this means (here: freewheeling). In this case (freewheeling), the current would thus flow at the node 120 between the two conductors 101, 102, in each of which one of the switching elements 311, 312 is respectively arranged.

Depending on the implementation, it would alternatively be conceivable for the switching elements 311, ..., 314 to be switched so as to give rise to a current flow in the upper part of the H-bridge. For example, in this case, the first switching element 311 and the second switching element 312 could be closed, while the third switching element 313 and the fourth switching element 314 would be open. At the upper node 120' a current flow between the two upper conductors would then take place in the manner described above, and would then in turn be detectable using a magnetic field sensor 110 mounted at the upper node 120'.

Figure 3C:
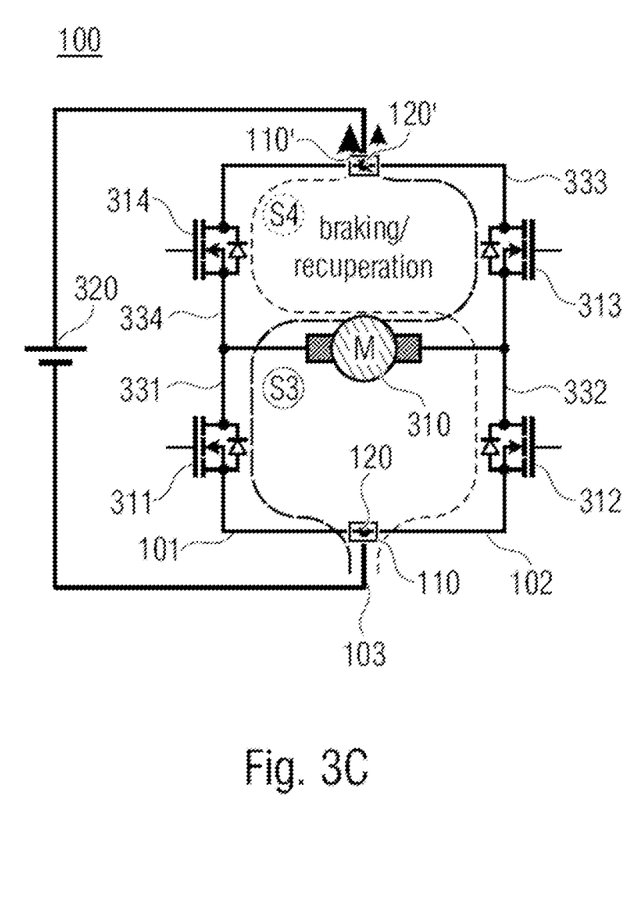

FIG. 3C shows one possibility for realizing a motor braking operating state or a recuperation motor operating state. Here the current flows are substantially exactly the opposite in comparison with the ON state in accordance with FIG. 3A. Consequently, the statements given above, in opposite directions in each case, equally hold true for the motor braking or recuperation operating state shown in FIG. 3C.

In the motor braking or recuperation operating state, it is possible (as is illustrated purely by way of example in FIG. 3C) for the current to flow from the third conductor 103 into the node 120, and from the node 120 into the first conductor 101. This is referred to hereinafter as a third current flow S3 or as a third current flow direction S3.

In order to be able to differentiate between an ON operating state (FIG. 3A) and a motor braking or recuperation operating state (FIG. 3C), the third current flow direction S3 is opposite to the above-described first current flow direction S1 in the ON operating state.

The magnetic fields generated here in the respective conductors 101, 103 can be measured in the manner described herein using the magnetic field sensor 110 mounted at the node 120. The magnetic field sensor 110 can deduce the abovementioned third current flow direction S3 based on the magnetic fields or magnetic field vectors measured at the node 120, and in particular based on the ascertained directions of the magnetic fields which are respectively generated in the individual conductors 101, 103.

The magnetic field sensor 110 (or a controller coupled to the magnetic field sensor 110) can derive the operating state of the motor 310 (here: motor braking or recuperation operating state) based on the ascertained current flow direction (here: the third current flow direction S3 from the third conductor 103 into the first conductor 101).

As mentioned initially, it may be conceivable for the current flow direction to be reversed. In the motor braking or recuperation operating state, the current would then flow from the first conductor 101 via the node 120 into the third conductor 103, which however would of course likewise be recognized by the magnetic field sensor 110.

The magnetic field sensor 110 can thus be configured to detect at the node 120 a current flow S3 between the first conductor 101 and the third conductor 103, irrespective of the direction in which the current is actually flowing in this case. However, the current flow in the motor braking or recuperation operating state is always opposite to the current flow in the ON operating state. That would mean that the third current flow S3 between the first conductor 101 and the third conductor 103 ascertained at the node 120 in the motor braking or recuperation operating state is always directed oppositely to the first current flow S1 between the first conductor 101 and the third conductor 103 ascertained at the node 120 in the ON operating state.

As has likewise been mentioned above, in the motor braking or recuperation operating state, depending on the implementation of the circuit, the current can alternatively also flow between the second conductor 102 and the third conductor 103 via the node 120. This is illustrated using dashed lines in FIG. 3C and is referred to hereinafter as a fourth current flow S4 or as a fourth current flow direction S4. Here, too, it once again holds true that the current flow in the motor braking or recuperation operating state S3, S4 is always opposite to the current flow S1, S2 in the ON operating state. That would mean that the fourth current flow S4 between the second conductor 102 and the third conductor 103 ascertained at the node 120 in the motor braking or recuperation operating state is always directed oppositely to the second current flow S2 between the second conductor 102 and the third conductor 103 ascertained at the node 120 in the ON operating state.

The magnetic field sensor 110 can thus be configured to detect a motor braking or recuperation operating state of the electric motor 310 using the magnetic field sensor 110 ascertaining at the node 120 a third current flow S3 directed between the first conductor 101 and the third conductor 103, the third current flow being opposite to the first current flow S1 in the ON operating state. Alternatively, or additionally, the magnetic field sensor 110 can detect the motor braking or recuperation operating state of the electric motor 310 using the magnetic field sensor 110 ascertaining at the node 120 a fourth current flow S4 directed between the second conductor 102 and the third conductor 103, the fourth current flow being directed opposite to the second current flow S2 in the ON operating state.

In order to be able to better distinguish between the respective operating states of the motor 310, it may be expedient if the current branches are also taken into account. That is to say if the current flow S2 in the ON operating state, as depicted by way of example in FIG. 3A, passes via the bottom right current branch 332 (e.g., second current flow S2 between the second conductor 102 and the third conductor 103), then the current flow S3 in the motor braking or recuperation operating state (FIG. 3C) should preferably pass via the bottom left current branch 331 in the opposite current flow direction (e.g., third current flow S3 between the first conductor 101 and the third conductor 103).

The same equally holds true the other way around. That would mean that if the current flow in the ON operating state (FIG. 3A) passed via the bottom left current branch 331 (e.g., first current flow S1 between the first conductor 101 and the third conductor 103), then the current flow S4 in the motor braking or recuperation operating state (FIG. 3C) should preferably pass via the bottom right current branch 332 in the opposite current flow direction (e.g., fourth current flow S4 between the second conductor 102 and the third conductor 103).

For the rest, everything that has been described with regard to the node 120 holds true exactly the same for the upper node 120'. Likewise, everything that has been described with regard to the magnetic field sensor 110 arranged at the node 120 holds true exactly the same for a magnetic field sensor 110' mounted at the upper node 120'.

Figure 4:
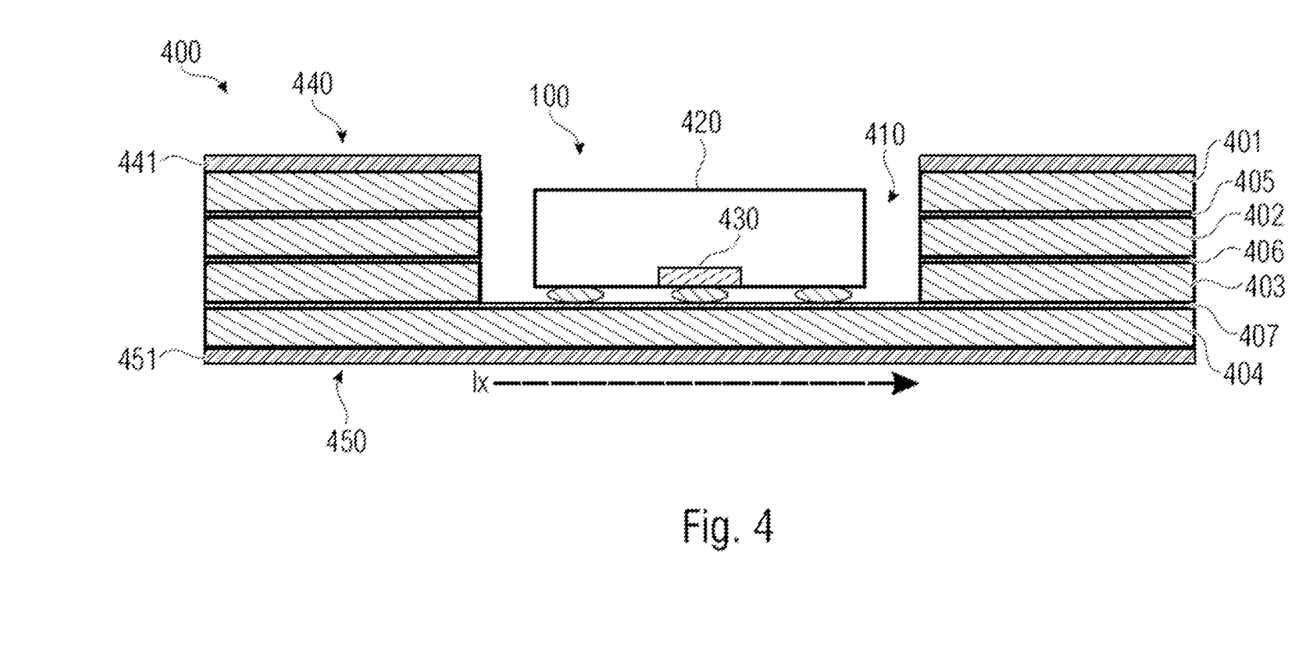
FIG. 4 shows a schematic view of a magnetic-field-based current measuring device in a package in accordance with one example implementation.
Figure 5:
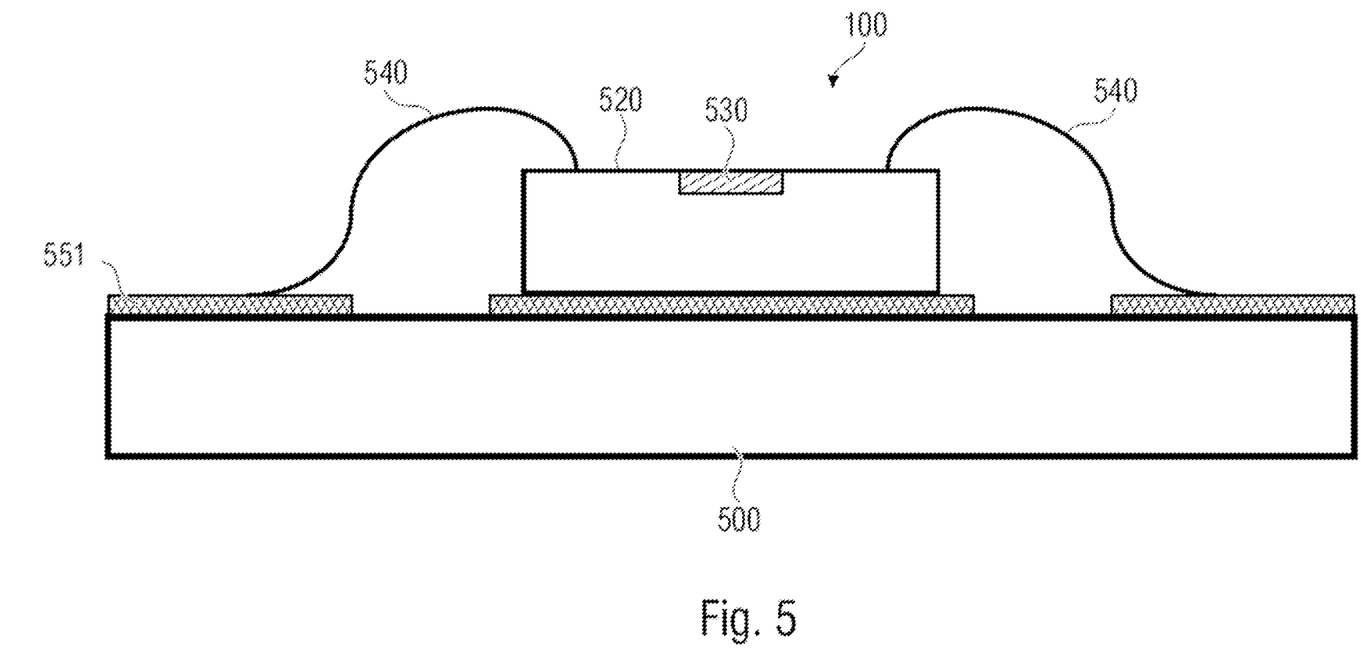
FIG. 5 shows a schematic view of a magnetic-field-based current measuring device, integrated in an unpackaged semiconductor chip, in accordance with one example implementation.

FIGS. 4 and 5 show advantageous configurations for the integration of a magnetic-field-based current measuring device 100 into existing system environments.

FIG. 4 shows a substrate 400. The latter can be a multilayer substrate. The substrate 400 can be configured for example in the form of a component board or PCB (PCB: Printed Component Board). The latter can be a multilayer PCB, for example.

The multilayer PCB can comprise a plurality of layers of a dielectric material 401, 402, 403, 404, wherein a respective signal-carrying conductor 405, 406, 407 can be arranged between these layers 401, 402, 403, 404. These signal-carrying conductors 405, 406, 407 are also referred to as signal layers.

Current-carrying conductor structures 441, 451 that include the first, second and third electrical conductors 101, 102, 103 described above can be arranged in each case on the mutually opposite outer surfaces 440, 450 of the multilayer PCB 400. One of the two current-carrying conductor structures 441, 451 can have a ground potential. The current-carrying conductor structures 441, 451 are also referred to as power layers.

The magnetic-field-based current measuring device 100 described herein or the magnetic field sensor 110 can be integrated in a package 420. The latter can be for example a WLB package or an eWLB package (eWLB: embedded Wafer Level Ball Grid Array). The magnetic-field-based current measuring device 100 can comprise a sensor region 430 that is sensitive to the magnetic field lines.

The substrate 400 can comprise a recess 410. The package 420 can be mounted within the recess 410 using flip-chip mounting technology such that the sensor region 430 of the magnetic field sensor 110 that is sensitive to the magnetic field lines faces the first, second and third electrical conductors 101, 102, 103. Using the package 420, and in particular the sensor region 430 of the magnetic field sensor 110 that is sensitive to the magnetic field lines, being positioned as near as possible to one of the power layers 441, 451, a higher sensitivity of the magnetic field sensor 110 can be attained.

FIG. 5 shows a further conceivable advantageous configuration. Here the magnetic-field-based current measuring device 100 or the magnetic field sensor 110 can be integrated in a chip 520, which can in turn be arranged on a substrate 500. The substrate 500 can be a ceramic substrate, e.g., a silicon substrate.

The substrate 500 can comprise one or a plurality of signal-carrying conductor structures (signal layer) and/or one or a plurality of current-carrying conductor structures 551 (power layer). A current-carrying conductor structure 551 (power layer) can comprise the electrical conductors 101, 102, 103 described above.

The chip 520 can be for example an unpackaged semiconductor chip (bare die). The chip 520 can be mounted face-up on the ceramic substrate 500, such that the sensor region 530 of the magnetic field sensor 110 that is sensitive to the magnetic field lines faces away from the ceramic substrate 500. The chip 520 can be contacted using bond wires 540 using wire bonding technology.

The chip 520 can be mounted on the conductor structure 551 (power layer), such that the sensor region 530 of the magnetic field sensor 110 that is sensitive to the magnetic field lines is situated opposite the conductor structure 551 and the electrical conductors 101, 102, 103 configured therein.

Figure 6:
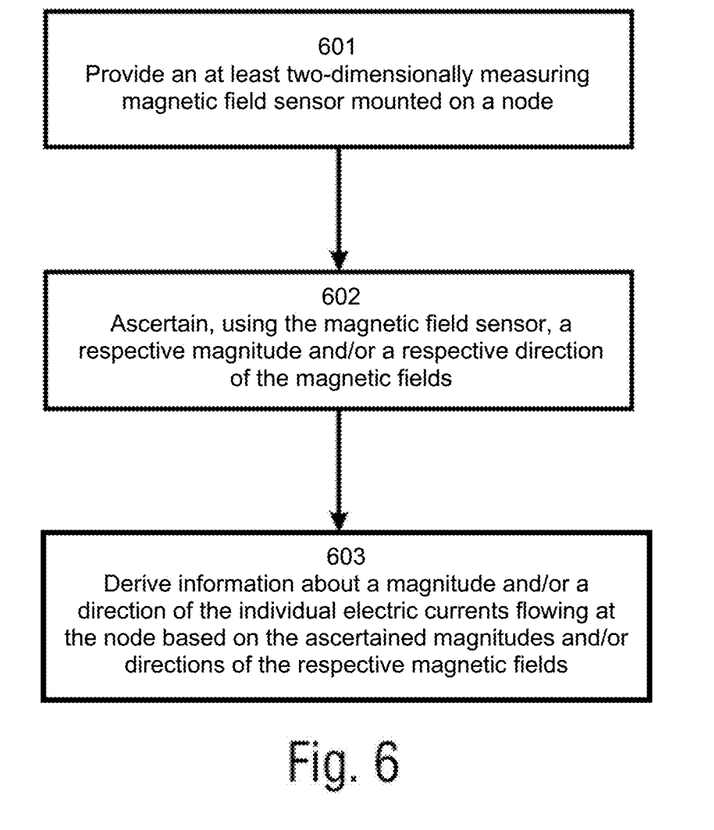
FIG. 6 shows a schematic block illustration of a method in accordance with one example implementation.

FIG. 6 shows a schematic block diagram of a method 600 for magnetic-field-based measurement of electric currents in accordance with one example implementation.

Block 601 involves providing an at least two-dimensionally measuring magnetic field sensor 110 mounted at a node 120 at which a first, second and third electrical conductor 101, 102, 103, each coming from different directions, are brought together.

Block 602 involves ascertaining, using the magnetic field sensor 110, a respective magnitude and/or a respective direction of the magnetic fields 111, 112, 113 which are respectively generated in the first, second and third electrical conductors 101, 102, 103 and meet at the node 120.

Block 603 involves deriving information about a magnitude and/or a direction of the individual electric currents $I_1$, $I_2$, $I_3$ flowing at the node 120 based on the ascertained magnitudes and/or directions of the respective magnetic fields 111, 112, 113.

In summary, the present disclosure includes systems and methods for a 2D or 3D current direction measurement. 3D Hall sensors, or 2D Hall sensors, having vertical Hall elements can be used for this purpose. A current direction can be measured, which can also be referred to as a direction-linked current measurement. By way of example, a two-dimensional Hall probe concept can be used to ascertain the current and the direction of the current on a common conductor connection. This information can be used to determine the current and the current source.

The concept presented herein can be used for a wide range of different applications, such as e.g.:
H bridges
BLDC motors
Distribution boxes
Applications with more than one load.

The concept presented herein affords a cost-effective and power-efficient solution (no additional power losses as in a shunt) for obtaining information about the current flowing, e.g., for functional reasons, for diagnosis purposes or in regard to safety-relevant aspects.

For this purpose a magnetic field sensor (e.g., 3D or 2D Hall sensor or xMR sensor) can be used in order to ascertain a current and its current flow direction, in order to find out from which load or from which loads the current or the currents originate(s). For this purpose, the magnetic field sensor can be positioned on a metal layer on which different currents from different directions meet. In some examples described herein, three currents from different directions can come together below the magnetic field sensor. The resulting magnetic field vector can be determined using the measured values of the magnetic field sensor. The magnetic field vector, indicating the magnitude and the direction of the magnetic field, includes information about the electric currents involved, provided that the values of the individual currents are measurable or appreciable.

ASPECTS

Application aspects in this respect would be H-bridge circuits for electric motor applications. With just a single magnetic field sensor, the individual currents can be measured and the motor operating state can be ascertained on the basis thereof. This is of interest for motor control, for diagnosis and for safety, but also in order to develop an understanding of when a motor braking state has concluded. One non-limiting aspect thereof would be an ATV cargo compartment: DC motors are usually used for this. The cargo compartment should be able to be opened and closed with the aid of this motor. In addition, however, it should also be able to be opened and closed in a simple manner by humans manually using physical strength. For this purpose, it is desirable to have a recognition of whether the cargo compartment or the motor is actuated by manual force, in order to switch from an ON state or a braking state to a freewheeling state, in order to enable simple opening and closing.

The aspect implementations described above merely represent an illustration of the principles of the innovative concept described herein. It goes without saying that modifications and variations of the arrangements and details described herein will become apparent to others skilled in the art. Therefore, the intention is for the concept described herein to be restricted only by the scope of protection of the patent claims hereinafter, and not by the specific details that have been presented based on the description and the explanation of the aspect implementations herein.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Some or all of the method steps can be carried out by a hardware apparatus (or using a hardware apparatus), such as, for example, a microprocessor, a programmable computer or an electronic circuit. In some aspect implementations, some or a plurality of the most important method steps can be performed by such an apparatus.

Depending on specific implementation requirements, aspect implementations can be implemented in hardware or in software or at least partly in hardware or at least partly in software. The implementation can be effected using a digital storage medium, for example a floppy disk, a DVD, a Blu-ray disk, a CD, a ROM, a PROM, an EPROM, an EEPROM or a FLASH memory, a hard disk or some other magnetic or optical storage unit on which are stored electronically readable control signals which can interact or interact with a programmable computer system in such a way that the respective method is carried out. Therefore, the digital storage medium can be computer-readable.

Some aspect implementations thus include a data carrier having electronically readable control signals which are able to interact with a programmable computer system in such a way that one of the methods described herein is carried out.

Generally, aspect implementations can be implemented as a computer program product including a program code, wherein the program code is effective for carrying out one of the methods when the computer program product runs on a computer.

The program code can for aspect also be stored on a machine-readable carrier.

Other aspect implementations include the computer program for carrying out one of the methods described herein, wherein the computer program is stored on a machine-readable carrier. In other words, one aspect implementation of the method described herein is therefore a computer program having a program code for carrying out one of the methods described herein when the computer program runs on a computer.

A further aspect implementation of the method described herein is therefore a data carrier (or a digital storage medium or a computer-readable medium) on which is recorded the computer program for carrying out one of the methods described herein. The data carrier or the digital storage medium or the computer-readable medium is typically tangible and/or nonvolatile.

A further aspect implementation of the method described herein is therefore a data stream or a sequence of signals which constitutes the computer program for carrying out one of the methods described herein. The data stream or the sequence of signals can be configured for aspect to the effect of being transferred via a data communication connection, for aspect via the Internet.

A further aspect implementation includes a processing device, for example a computer or a programmable logic component, which is configured or adapted to the effect of carrying out one of the methods described herein.

A further aspect implementation includes a computer on which the computer program for carrying out one of the methods described herein is installed.

A further aspect implementation includes a device or a system configured to transmit a computer program for carrying out at least one of the methods described herein to a receiver. The transmission can be effected electronically or optically, for example. The receiver can be, for example, a computer, a mobile device, a memory device or a similar device. The device or the system can include for example a file server for transmitting the computer program to the receiver.

In some example implementations, a programmable logic component (for example a field programmable gate array, an FPGA) can be used to carry out some or all functionalities of the methods described herein. In some aspect implementations, a field programmable gate array can interact with a microprocessor in order to carry out one of the methods described herein. Generally, in some aspect implementations, the methods are carried out on the part of an arbitrary hardware device. The latter can be universally usable hardware such as a computer processor (CPU) or hardware specific to the method, such as an ASIC, for example.

What is claimed is:

1. A magnetic-field-based current measuring device comprising:
    an at least two-dimensionally measuring magnetic field sensor mounted at a node at which a first electrical conductor, a second electrical conductor, and a third electrical conductor, each coming from different directions, are brought together,
        wherein the magnetic field sensor is configured to determine in each case one or more of a magnitude or a direction of magnetic fields which are respectively generated in the first electrical conductor, the second electrical conductor, and the third electrical conductor and meet at the node, and
        wherein the magnetic field sensor is configured to derive, based on the determined one or more of the magnitude or direction of magnetic fields, information about one or more of a magnitude of individual electric currents flowing at the node or a direction of the individual electric currents flowing at the node; and
    an electric motor and four switching elements, which together with the electric motor are interconnected in an H-bridge circuit,
        wherein the first electrical conductor is connected to a first switching element,
        wherein the second electrical conductor is connected to a second switching element, and
        wherein the third electrical conductor is connected to a voltage supply.

2. The magnetic-field-based current measuring device as claimed in claim 1,
    wherein the magnetic field sensor is configured to determine, based on the direction of the magnetic fields determined in each case at the node, in which direction a first electric current in the first electrical conductor, a second electric current in the second electrical conductor, and a third electric current in the third electrical conductor respectively flow.

3. The magnetic-field-based current measuring device as claimed in claim 1,
    wherein the magnetic field sensor is configured to determine, based on the magnitude of the magnetic fields determined in each case at the node, a respective magnitude of a first electric current in the first electrical conductor, a second electric current in the second electrical conductor and a third electric current in the third electrical conductor.

4. The magnetic-field-based current measuring device as claimed in claim 1,
    wherein the magnetic field sensor is configured to deduce an operating state of an electrical or electronic component connected to the first electrical conductor, the second electrical conductor, and the third electrical conductor based on the determined one or more of the direction or the magnitude of the respective magnetic fields which meet at the node.

5. The magnetic-field-based current measuring device as claimed in claim 1,
    wherein the magnetic field sensor is configured to detect an active ON operating state of the electric motor,
        using the magnetic field sensor ascertaining a first current flow between the first electrical conductor and the third electrical conductor at the node, or
        using the magnetic field sensor ascertaining a second current flow between the second electrical conductor and the third electrical conductor at the node.

6. The magnetic-field-based current measuring device as claimed in claim 5,
    wherein the magnetic field sensor is configured to detect a motor braking operating state or a recuperation operating state of the electric motor,
        using the magnetic field sensor ascertaining a third current flow between the first electrical conductor and the third electrical conductor, which is directed oppositely to the first current flow in the ON operating state, at the node), or
        using the magnetic field sensor ascertaining a fourth current flow between the second electrical conductor and the third electrical conductor, which is directed oppositely to the second current flow in the ON operating state, at the node.

7. The magnetic-field-based current measuring device as claimed in claim 1,
    wherein the magnetic field sensor is configured to detect a freewheeling operating state of the electric motor,
        using the magnetic field sensor ascertaining a current flow between the first electrical conductor and the second electrical conductor at the node.

8. The magnetic-field-based current measuring device as claimed in claim 1,
    furthermore comprising a fourth electrical conductor, which, coming from a different fourth direction, is coupled to the node.

9. The magnetic-field-based current measuring device as claimed in claim 8,
    wherein the first electrical conductor, the second electrical conductor, the third electrical conductor, and the fourth electrical conductor are brought together at the node in such a way that two adjacent electrical conductors, of the first, second, third and fourth electrical conductors, are offset at an angle of 90° from one another.

10. The magnetic-field-based current measuring device as claimed in claim 1,
    wherein the magnetic field sensor is configured as a Hall sensor comprising two vertical Hall elements arranged offset at an angle of 90° with respect to one another.

11. The magnetic-field-based current measuring device as claimed in claim 10,
    wherein the Hall sensor comprises four vertical Hall elements that are offset from one another.

12. The magnetic-field-based current measuring device as claimed in claim 1,
    wherein the magnetic field sensor is configured as a magnetoresistive sensor.

13. The magnetic-field-based current measuring device as claimed in claim 1, wherein the magnetic field sensor is configured as a three-dimensionally measuring magnetic field sensor.

14. The magnetic-field-based current measuring device as claimed in claim 1,
wherein the magnetic field sensor is integrated in a chip arranged on a ceramic substrate,
wherein the first electrical conductor, the second electrical conductor, and the third electrical conductor are configured in the form of a current-carrying conductor structure on the ceramic substrate, and
wherein the chip is mounted on the conductor structure such that a sensor region of the magnetic field sensor that is sensitive to magnetic field lines is situated opposite the first electrical conductor, the second electrical conductor, and the third electrical conductor.

15. The magnetic-field-based current measuring device as claimed in claim 1,
wherein the magnetic field sensor is integrated in a package arranged in a recess of a multilayer PCB,
wherein the multilayer PCB comprises a plurality of layers of a dielectric material, wherein a respective signal-carrying conductor structure is arranged between the plurality of layers, and wherein one or a plurality of current-carrying conductor structures that include the first electrical conductor, the second electrical conductor, and the third electrical conductor are arranged in each case on mutually opposite outer surfaces of the multilayer PCB,
wherein the package is mounted within the recess using flip-chip mounting technology such that a sensor region of the magnetic field sensor that is sensitive to magnetic field lines faces the first electrical conductor, the second electrical conductor, and the third electrical conductor.

16. A method for magnetic-field-based measurement of electric currents, wherein the method comprises:
providing an at least two-dimensionally measuring magnetic field sensor mounted at a node at which a first electrical conductor, a second electrical conductor, and a third electrical conductor, each coming from different directions, are brought together;
ascertaining, using the magnetic field sensor, one or more of a respective magnitude a respective direction of the magnetic fields which are respectively generated in the first electrical conductor, the second electrical conductor, and the third electrical conductor and meet at the node;
deriving information associated with one or more of a magnitude or a direction of individual electric currents flowing at the node based on the ascertained one or more of the respective magnitude or respective direction of the magnetic fields; and
providing an electric motor and four switching elements, which together with the electric motor are interconnected in an H-bridge circuit,
wherein the first electrical conductor is connected to a first switching element,
wherein the second electrical conductor is connected to a second switching element, and
wherein the third electrical conductor is connected to a voltage supply.

17. A computer program comprising a program code for carrying out the method as claimed in claim 16 when the program runs on a computer.

18. The method of claim 16, further comprising:
detecting an active operating state of the electric motor based on:
ascertaining a first current flow between the first electrical conductor and the third electrical conductor at the node, or
ascertaining a second current flow between the second electrical conductor and the third electrical conductor at the node.

19. The method of claim 16, further comprising:
detecting an operating state of the electric motor.

20. The method of claim 19, wherein the operating state includes at least one of:
an active operating state,
a motor braking operating state,
a recuperation operating state, or
a freewheeling operation state.

* * * * *